United States Patent
Fujimoto et al.

(10) Patent No.: US 6,967,171 B2
(45) Date of Patent: Nov. 22, 2005

(54) INSULATION FILM ETCHING METHOD

(75) Inventors: Kiwamu Fujimoto, Nirasaki (JP); Nobuhiro Wada, Nirasaki (JP)

(73) Assignee: Tokyo Electron Limited, Tokyo-To (JP)

( * ) Notice: Subject to any disclaimer, the term of this patent is extended or adjusted under 35 U.S.C. 154(b) by 181 days.

(21) Appl. No.: 10/653,707

(22) Filed: Aug. 28, 2003

(65) Prior Publication Data
US 2005/0112879 A1    May 26, 2005

(30) Foreign Application Priority Data
Aug. 28, 2002    (JP) ............................. 2002-248074

(51) Int. Cl.$^7$ ............................................. H01L 21/302

(52) U.S. Cl. ..................... 438/714; 438/706; 438/710; 438/716; 438/734

(58) Field of Search ............................... 438/706, 707, 438/710, 711, 714, 716, 733, 734, 735

(56) References Cited

U.S. PATENT DOCUMENTS

| | | | |
|---|---|---|---|
| 6,613,689 B2 * | 9/2003 | Liu et al. ................... | 438/710 |
| 6,712,983 B2 * | 3/2004 | Zhao et al. ................. | 438/714 |
| 2003/0068582 A1 * | 4/2003 | Komada et al. ............ | 438/707 |
| 2004/0106293 A1 * | 6/2004 | Igarashi ...................... | 438/690 |
| 2004/0171273 A1 * | 9/2004 | Oyama et al. .............. | 438/710 |

* cited by examiner

Primary Examiner—Kevin M. Picardat
(74) Attorney, Agent, or Firm—Smith, Gambrell & Russell, LLP

(57) ABSTRACT

The insulation film etching method according to the present invention prevents the pause of etching an insulation film while ensuring a good anisotropic (vertical) configuration and high selectivity to both the mask and the base film.

When the first step plasma etching using $CHF_3/Ar/N_2$ mixed gas is ended, Ar gas as a purging gas is fed into a processing vessel from an Ar gas supply source 46 with the plasmas extinguished, whereby residual hydrogen and hydrogen compounds in the processing vessel 10 are whirled by the purging gas to be discharged through an exhaust port 10b and through an exhaust pipe 52. When the purging step is completed, the second step plasma etching is performed with $C_4F_8/Ar/N_2$ mixed gas.

19 Claims, 2 Drawing Sheets

INSULATION FILM ETCHING METHOD

BACKGROUND OF THE INVENTION

1. Field of the Invention

The present invention relates to a technique for etching insulation films, more specifically an etching method suitably used in etching the inter-layer insulation films of a multi-layer interconnection structure.

2. Background Art

With the micronization of the interconnection layers and higher operational speed of semiconductor devices, the inter-layer insulation films are required to have low dielectric constants. Recently, organic low dielectric (low-k) films, especially SiOC-based low-k films are noted.

As the etching gases for the organic low-k films, mixed gases containing carbon fluoride-based gases as the main etching gases have been conventionally used. For example, in the plasma etching for forming via holes in an organic low-k film formed on a silicon nitride film, $C_4F_8/Ar/N_2$ mixed gas, which is more selective to the silicon nitride film as the base film is dominantly used. However, $C_4F_8/Ar/N_2$ mixed gas has a limitation in the etching rate of the low-k film and additionally has low selectivity to the resist film of the mask pattern. Accordingly, there is a risk that anisotropic (vertical) configurations may not be formed.

Then, in place of the above-described etching method using $C_4F_8$-based gas, the two-step method is proposed; i.e., first with $CHF_3/Ar/N_2$ mixed gas as the etching gas, the organic low-k film is etched down to a prescribed depth from the surface thereof in the openings of the mask, and then the etching gas is replaced by $C_4F_8/Ar/N_2$ mixed gas to continue the etching, and when the etching arrives at the silicon nitride film, which is a lower layer or the base, the etching is completed.

In this two-step method, as the first processing, the plasma etching of the first step using $CHF_3/Ar/N_2$ mixed gas, because of a relatively small amount of the F radicals, the resist is not easily etched. On the other hand, the organic low-k film well reacts with radical species and ions in the plasmas to efficiently generate volatile products, such as $SiF_x$, $CO_x$, CNH, etc. and is etched vertical configurations at high etching rates. However, because $CHF_3/Ar/N_2$ mixed gas has low selectivity to the base film (silicon nitride film), $CHF_3/Ar/N_2$ mixed gas must be replaced by $C_4F_8/Ar/N_2$ mixed gas in the etching.

SUMMARY OF THE INVENTION

However, the above-described two-step etching method has risks that the etching is slowed down immediately after the second step plasma etching has taken the place, resultantly decreasing a via hole diameter (decreasingly tapered) or often interrupting the etching inside the low-k film (before the etching arrives at the base film.

Then, an object of the present invention is to provide an etching method which can etch an insulation film stably and without failure, ensuring a good anisotropic (vertical) configuration and high selectivity to both the mask and the base film.

To attain the above-described object, the insulation film etching method according to one aspect of the present invention, in which plasmas of etching gases are generated in a processing vessel to etch an insulation film on a substrate-to-be-processed through a mask pattern in an atmosphere of the plasmas comprises the first step of introducing into the processing vessel a first etching gas containing carbon, fluorine and hydrogen to etch the insulation film down to a prescribed depth; the second step of discharging at least one of hydrogen and hydrogen compounds residing in the processing vessel out of the processing vessel; and the third step of introducing a second etching gas containing carbon and fluorine but containing no hydrogen to uninterruptedly continue etching the insulation film.

According to the etching method of the present invention, in the first step of plasma etching, H (hydrogen) contained in the first etching gas is bonded with F (fluorine) radicals and $CDF_x$ radicals to generate HF, and films of CF, $CF_2$ having a few F atom numbers or their polymers are deposited on the surface of the mask pattern to thereby suppress the etching and exfoliation of the surface of the mask pattern. On the other hand, inside the opening of the mask pattern, O (oxygen) atoms generated from the insulation film by the etching react with CF and $CF_2$ to thereby generate volatile $CO_x$, COF and $COF_2$, which advances the etching.

When the plasma etching of the first processing (the first step) is stopped, the atoms and compounds which have been the radical species and the ions, are released from the plasma excitation and remain in the processing vessel. Some of the first etching gas which has been introduced into the processing vessel also remains. These residues contain hydrogen or hydrogen compounds. When the plasma etching of the second step follows in this state, as does conventionally, the residual hydrogen deposits CH-based polymers near the bottom of the hole, or reacts with the main etchant, e.g., nitrogen radical to thereby substantially extinguish the nitrogen radicals, which resultantly hinders the etching progress.

Then, in the present invention, when the plasma etching of the first processing (the first step) is stopped, at least one of hydrogen and hydrogen compounds residing in the processing vessel is discharged from the processing vessel in the second processing, and then in the third processing, the plasma etching of the second step is performed. In the plasma etching of the second step, the second etching gas itself contains no hydrogen and furthermore has the residual hydrogen removed. Accordingly without etching defects (especially etching stop) due to the hydrogen, the etching can be stably advanced or continued.

In the present invention, one example of the second step is purging the interior of the processing vessel with an inert gas.

In this case, when the first etching gas used in the first processing (the first step) contains an inert gas (e.g., Ar), it is preferable to use an inert gas (Ar) of the same kind is used as the purging gas. The purging using this inert gas can efficiently remove hydrogen and hydrogen compounds residing in the processing vessel for a short period of time.

As another preferable example of the second process, it is effective to introduce $O_2$ gas into the processing vessel to form a plasma atmosphere. The flash with the $O_2$ plasmas can react the hydrogen and hydrogen compounds residing in the processing vessel with oxygen to thereby discharge them outside in the form of steam or others.

As further another preferable example of the second process, although it takes more time, it is simple and effective to exhaust the interior of the processing vessel for above a prescribed period of time (e.g., 10 minutes) without introducing fresh gas and with the plasmas turned off.

The insulation film etching method according to another aspect of the present invention, in which plasmas of etching gases are generated in processing vessels to etch an insulation film on a substrate-to-be-processed through a mask pattern in an atmosphere of the plasmas, comprises the first step of introducing a first etching gas containing carbon, fluorine and hydrogen into a first processing vessel to etch the insulation film down to a certain depth; the second step of transferring the substrate-to-be-processed from the first processing vessel to a second processing vessel; and the third step of introducing a second etching gas containing carbon and fluorine but containing no hydrogen into the second processing vessel to continue etching the insulation film.

Even in the present etching method, when the etching of the first processing (the first step) is stopped, hydrogen and hydrogen compounds resides in the first processing vessel. However, the substrate-to-be-processed etched in the first processing vessel is transferred to the second processing vessel, which allows the plasma etching of the third processing (the second step) to be made on the substrate in the second processing vessel having no residual hydrogen. In this method as well, the plasma etching of the first processing (the first step) can ensure high selectivity to the mask and good anisotropic (vertical) configurations, and in the plasma etching of the third processing (the second step), the etching can ensure high selectivity to the mask without etching defects, such as etching stop, etc., and with high selectivity to the base film.

The etching method according to the present invention is effective for organic insulation films, especially SiOC-based low dielectric constant films, and is especially effective for the etching for forming via holes. In the present specification SiOC-based films are defined as organic film. The mask pattern may be formed typically of resist film, and the base film may be nitride film, e.g., silicon nitride film or may be formed of silicon carbide.

In the etching method according to the present invention, one preferable example of the first etching gas is a mixed gas containing hydrophloro carbon gas, $N_2$ gas and an inert gas. On preferable example of the second etching gas is a mixed gas containing phlorocarbon gas, $N_2$ gas and an inert gas. The inert gas is preferably Ar but can be He, Ne and Kr. Hydrophlorocarbon gas is typically $CHF_3$ but can be $CH_2F_2$, $CH_3F$, $C_2H_2F_4$. Phlorocarbon gas is typically $C_4F_8$ and may include $C_2F_4$, $C_3F_6$, $C_3F_8$, $C_4F_6$, $C_5F_8$ (including linear and cyclic isomers).

DESCRIPTION OF PREFERRED EMBODIMENTS

A preferred embodiment of the present invention will be explained below.

Figure 1:
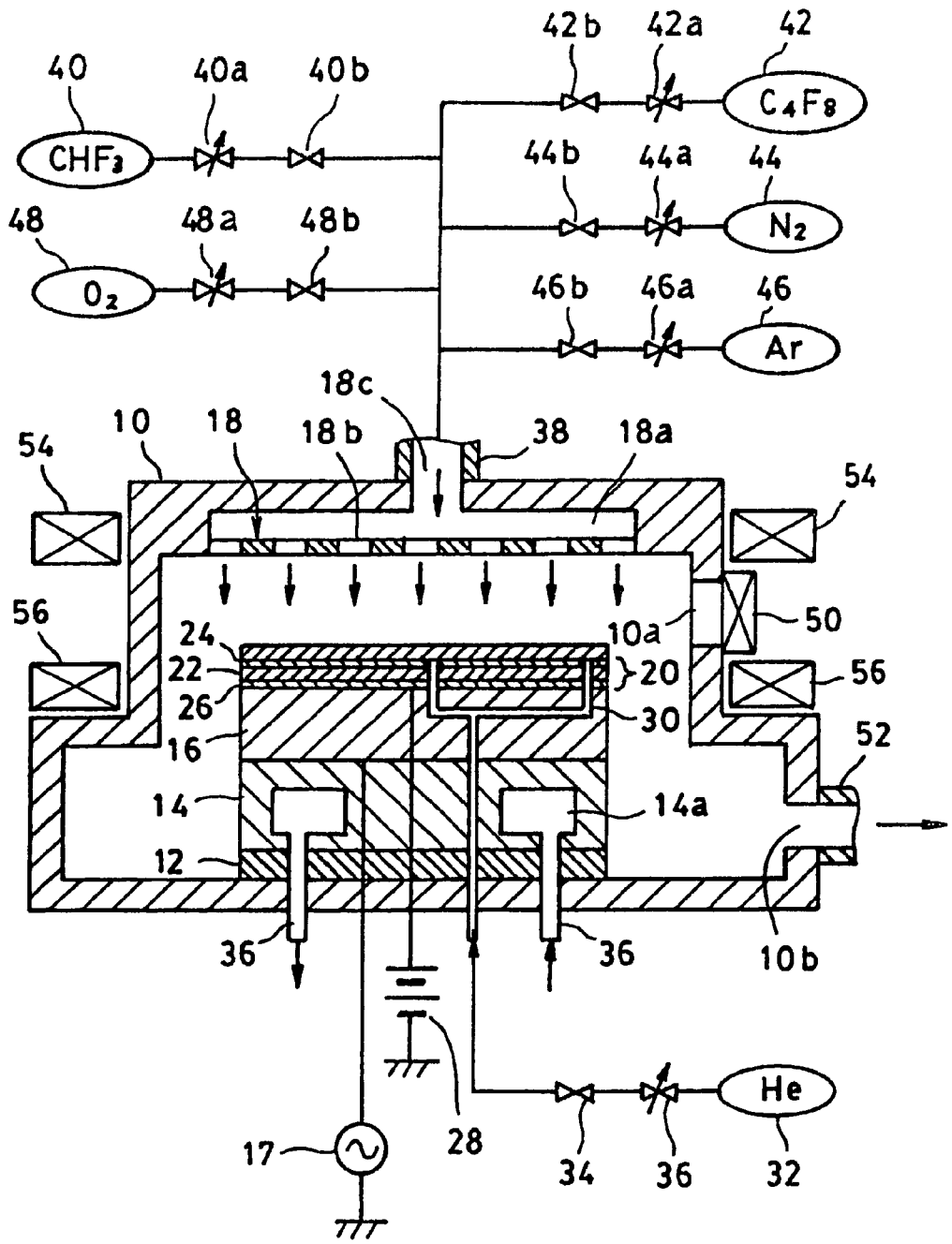
FIG. 1 is a sectional view of an etching system for performing the etching method according to one embodiment of the present invention.

FIG. 1 shows the structure of an etching system for performing the etching method according to one embodiment of the present invention.

The etching system includes a tightly closable cylindrical processing vessel 10 of, e.g., aluminum. In the processing vessel 10, a susceptor 16 is disposed at the center of the bottom surface with an insulation plate 12 and a support base 14 disposed therebetween. A shower head 18 is disposed on the ceiling right above the susceptor 16. The susceptor 16 also functions as a lower electrode. The shower head 18 functions as an upper electrode. The susceptor 16 is electrically connected to a radio-frequency electric power source 17 of, e.g., 13.56 MHz. The output of the radio-frequency electric power source 17 is controlled by a controller (not shown).

An elecrostatic chuck 20 for electrostatically adsorbing a substrate to be processed, e.g., a semiconductor wafer W is mounted on the upper surface of the susceptor 16. The electrostatic chuck 20 comprises a conducting film 22 sandwiched by a pair of an upper and a lower polyimide films 24, 26. A prescribed d.c. voltage is applied to the lower film 26 from a d.c. power source 28 to secure a semiconductor substrate W on the susceptor 16 by the coulomb force.

A gas passage 30 for supplying He gas to the underside of the a semiconductor wafer W secured to the susceptor 16 is provided in the susceptor 16 and the electrostatic chuck 20. He gas from an He gas supply source 32 passes through the gas passage 30 to be ejected from a plurality of ejection ports onto the underside of the semiconductor wafer W so as to cool the semiconductor wafer W. The supply pressure of the He gas is adjusted by a pressure adjusting valve 36, and the He gas supply is turned on and off by an opening/closing valve 34. In the support base 14, a coolant passage 14a is extended, e.g., circumferentially. A coolant, e.g., cooling water of a prescribed temperature is circulatorily supplied to the coolant passage 14a through a pipe 36 by a chiller unit (not shown) installed outside.

The shower head 18 has a buffer chamber 18a inside and a number of gas ejection ports 18b in the lower surface. A main gas supply pipe 38 is connected to a gas inlet port 18c provided in the upper surface of the shower head 18. Gas introduced into the buffer chamber 18a through the main gas supply pipe 38 and through the gas introduction port 18c is temporarily stored in the buffer chamber 18a to be diffused homogeneous and is ejected through the gas ejection ports 18b onto the upper surface of the susceptor 16.

The main gas supply pipe 38 is connected to supply sources of various raw material gases through the respective exclusive gas supply pipes or branched gas supply pipes which constitute a processing gas supply unit. In the present embodiment, as will be described later, $CHF_3$, $C_4F_8$, Ar, $N_2$ are used as raw material gases of an etching mixed gas, and $O_2$ is used as a raw material gas for $O_2$ flash. The gas supply sources 40–48 for supplying these raw material gases are prepared. In the respective exclusive gas supply pipes there are inserted flow rate adjusting valves (or mass flow controller) 40a–48a and opening closing valves 40b–48b which can be controlled respectively independently of each other by a control unit (not shown).

A substrate loading-unloading opening 10a and an exhaust port 10b are formed in the side wall of the processing vessel 10. A gate mechanism, e.g., a gate valve 50 is disposed outside the substrate loading/unloading opening 10a adjacent thereto. The exhaust port 10b is in communication with a vacuum pump (not shown) through an exhaust pipe 52. A pair of an upper and a lower die ball ring magnets which are annular or concentric are disposed around the side wall of the processing vessel 10 upper and lower of the substrate loading/unloading port 10a, extended horizontally. The DRMs 54, 56 form magnetic fields for increasing the plasma density between the susceptor 16 and the shower head 18 in the processing vessel 10.

Next, the etching method according to one embodiment of the present invention, which is practicable by the above-described etching system will be explained. In the present embodiment, a via hole is formed in an inter-layer insulation film of an organic low-k film.

First, with the gate valve 50 of the etching system (FIG. 1) opened, a semiconductor wafer W is loaded into the processing vessel 10 through the substrate loading/unloading opening 10a. In the processing chamber, the semiconductor wafer W is mounted on the susceptor 16 and further retained by the electrostatic chuck 20. After the semiconductor wafer W has been loaded, the gate valve 50 is closed, and the interior of the processing vessel 10 is exhausted by the vacuum pump of the exhaust unit to be evacuated down to, e.g., around 100 mTorr. He gas is supplied to the underside of the semiconductor wafer from the He gas supply source 32 through the gas passage 30 while cooling water is supplied to the coolant passage 14a of the support base 14 from the outside chiller unit.

Figure 2:
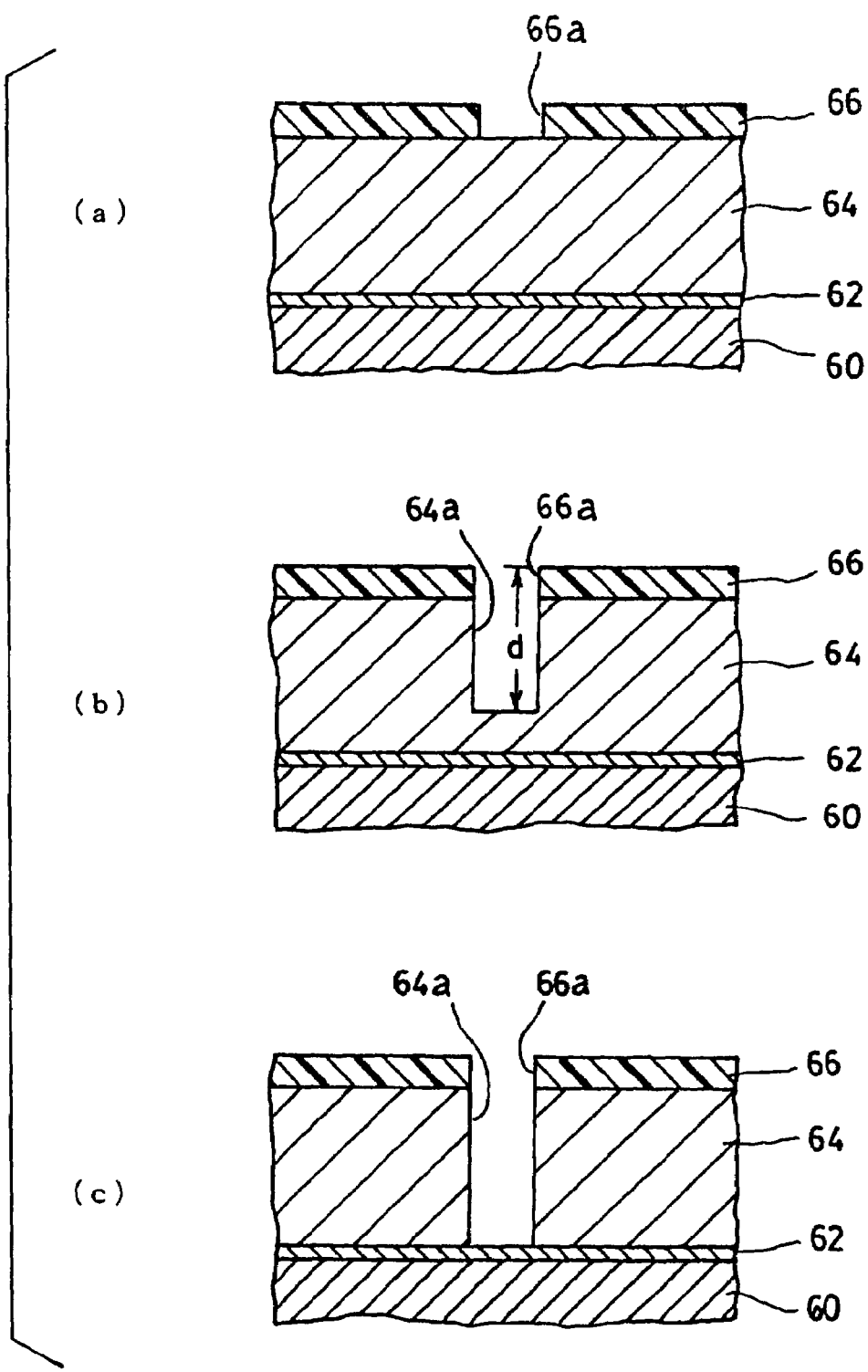
FIG. 2 is sectional views of a multi-layer interconnection structure, which explain the operation of the etching method according to the present embodiment.

As shown in FIG. 2A, on the primary surface of the semiconductor wafer W loaded in to the processing vessel 10, a lower interconnection layer 60, a barrier layer 62, an organic low-k film (an inter-layer insulation film) 64 and a mask 66, which form a multi-layer interconnection structure are laid the latter on the former in the stated order. The interconnection layer 60 is, e.g., a Cu interconnection layer and is processed by, e.g., dual damascening. The barrier layer 62 is a silicon nitride film (SiN) film of, e.g., a 1000 Å (0.1 µm) thickness and is formed by, e.g., CVD (Chemical Vapor Deposition). The organic low-k film 64 is an SiOC-based low-k film of, e.g., a 1 µm-thickness and is formed by, e.g., CVD. The mask 66 is, e.g., a resist film and is formed by the usual resist application. The mask 66 is patterned by exposure and development and has an opening 66a formed in the position where the via hole is to be formed.

In the present embodiment, such semiconductor wafer W is etched by the two-step etching method.

First, as the first step, the first step plasma etching is performed. In the first step, $CHF_3/Ar/N_2$ mixed gas as the etching gas is supplied from the processing gas supply unit to the shower head 18 of the processing vessel 10. On the other hand, a radio-frequency electric power is supplied to the susceptor 16 from the radio-frequency electric power source 17. As one example of the etching conditions, the flow rate ratio of the $CHF_3/Ar/N_2$ is 20/1000/40 sccm, and the RF electric power is 1700 W. The pressure in the processing vessel 10 is, e.g., 75 mTorr, the He pressure on the underside of the wafer W is 5/20 Torr at the center/the edge, and the temperature is 60° C./60° C./60° C. at the lower electrode/the upper electrode/the vessel side wall.

Between the shower head 18 (the upper electrode) and the susceptor 16 (the lower electrode), magnetron discharge is caused by radio-frequency electric fields applied from or formed by the radio-frequency electric power source 17 in the space where magnetic fields are formed by the die ball magnets 54, 56, and the etching gas, i.e., the $CHF_3/Ar/N_2$ mixed gas is supplied to the discharge space, whereby the molecules of these gases are dissociated, and plasmas are generated. Radical species and reactive ions generated from the plasmas fall on or enter the semiconductor wafer W on the susceptor 16. In this case, H dissociated from the $CHF_3$ bonds with the F radicals and $CF_x$ radicals to generate HF and $CF_{x-1}$, whereby the SiOC-based low-k film 64 can be etched into a vertical configuration with the etching of the resist mask 66 sufficiently suppressed, i.e., with sufficiently high selectivity.

As shown in FIG. 2B, the first step plasma etching ends when the bottom of the hole 64a which is to be formed in the SiOC-based low-k film 64 in the opening 66a of the resist 66 arrives at a prescribed depth. The etching is ended by stopping supplying the $CHF_3/Ar/N_2$ mixed gas from the processing gas supply unit, i.e., closing the opening/closing valves 40b, 44b, 46b of the respective gas supply sources 40, 44, 46 and turning off the output of the radio-frequency electric power source 17. The exhaust unit continues exhausting the processing vessel 10.

Then, as the second step, Ar gas is fed as the purging gas into the processing vessel 10 from the Ar gas supply source 46 of the processing gas supply unit, whereby hydrogen and hydrogen compounds residing in the processing vessel 10 is whirled together with other residual substances by the purging gas to be discharged through the exhaust port 10b and through the exhaust pipe 52. To be specific, when the flow rate of the Ar gas is 1000 sccm, and the exhaust rate is 800 l/s, the residence time (an average residing time of the gas molecules from the introduction into the processing vessel to the exhaust) can be 2.48 ms. In this case, the time of the purging step may be set to be about several seconds. The Ar gas to be used as the purging gas has been used in the first step plasma etching as one component gas of the etching gas, which allows the first step plasma etching step to be followed by the purging step with the opening/closing valve 46b of the Ar gas supply source 46 set open.

The above-described purging step is followed by the second step plasma etching as the third step. In the second step, the $C_4F_9/Ar/N_2$ mixed gas is supplied from the processing gas supply unit to the shower head 18. On the other hand, the output of the radio-frequency electric power source 18 is tuned on. As one example of the etching conditions, the flow rate ratio of the $C_4F_9/Ar/N_2$ mixed gas is 5/1000/150 sccm (the total flow rate: 1155 sccm, the ratio of the Ar flow rate: 87%), the RF electric power is 1700 W, the pressure is 100 mTorr, the He pressure at the underside of the wafer W is 5/20 Torr for the center/the edge, and the temperature is 60° C./60° C./60° C. for the lower electrode/ the upper electrode/the vessel side wall.

As shown in FIG. 2C, in the second step plasma etching, the SiOC-based film 64 can be etched down to the base film 62 anisotropically (in the vertical configuration) without interrupting the etching and with high selectivity. $C_4F_8/Ar/N_2$ mixed gas has a property of low selectivity to the resist mask 66. However, the SiOC-based low-k film 64 has been etched by a considerable percentage (about 80%) in the first step, and a required etching rate (about 20%) to be borne by the second step is low, and the substantive resistivity can be provided for the resist mask 66.

As described above, in the present embodiment, the purging step using Ar gas is inserted between the first step plasma etching using $CHF_3/Ar/N_2$ mixed gas and the second step plasma etching using $C_4F_8/Ar/N_2$ mixed gas to thereby remove residual hydrogen in the processing vessel 10, whereby the plasma etching of the second step is smoothly advanced to form the hole 64a without failure.

Furthermore, in the present embodiment, the Ar flow rate to the total flow rate of the $C_4F_8/N_2$ mixed gas used in the second step plasma etching is set to be above 80%. These conditions increase the sputtering power of the Ar ions to effectively remove carbon-based polymers deposited on the side wall of the hole 64a while intruding the carbon-based polymers deep into the hole to deposit them on the base film (silicon nitride film) 62. Thus, the etching action of the fluorine-based radicals onto the base film (silicon nitride film) 62 is decreased, increasing the selectivity.

In the second step of the present embodiment, the above-described purging step may be replaced by flash with $O_2$ plasmas. More specifically, when the first step plasma etching is over, the supply of the etching gas, i.e., $CHF_3/Ar/N_2$ mixed gas is stopped while the output of the radio-frequency electric power source 17 is turned off to completely extinguish the plasmas. Then, $O_2$ gas is fed from the $O_2$ gas supply source 48 into the processing vessel 10, while the output of the radio-frequency electric power source 17 is turned on, to generate $O_2$ plasmas. Hydrogen (O) radicals in the $O_2$ plasmas react with the residual hydrogen to generate steam. The thus-generated steam is quickly discharged through the exhaust port 10a.

As another means of removing the residual hydrogen, in the second step, with the gas supply to the processing vessel 10 stopped and the radio-frequency electric power source 17 kept turned off, the exhaust by the exhaust unit is set on for a prescribed period of time, for, e.g., 10 seconds to thereby discharge a considerable amount of the residual hydrogen from the processing vessel 10.

Otherwise, a plurality of the etching systems (FIG. 1) according to the present embodiment, e.g., 2 etching systems are arranged near each other in a cluster. The first step etching is performed on a semiconductor wafer W in one of the etching system, and then the semiconductor wafer W is transferred by a substrate transfer mechanism to the other etching system where the second step plasma etching is performed without the problem of the residual hydrogen.

In the above-described embodiment, $CHF_3/Ar/N_2$ mixed gas is used in the first step plasma etching, and in the second step plasma etching, $C_4F_8/Ar/N_2$ mixed gas is used. Depending on insulation film materials, mask materials, base film materials, etc., these kinds and components of the etching gases can be variously changed, or kinds and components of the etching gases can be selected. For example, the mixed bas of phlorocarbon gas and $H_2$ gas is can be used as the first etching gas for the first step. The base film 62 can be silicon carbide (SiC) film.

As described above, the etching method according to the present embodiment can etch an insulation film stably and without failure, ensuring good anisotropic (vertical) configurations and high selectivity to both the mask and the base film.

What is claimed is:

1. An insulation film etching method for generating plasmas of etching gases in a processing vessel to etch an insulation film on a substrate-to-be-processed through a mask pattern in an atmosphere of the plasmas, comprising:
   the first step of introducing into the processing vessel a first etching gas containing carbon, fluorine and hydrogen to etch the insulation film down to a prescribed depth;
   the second step of discharging at least one of hydrogen and hydrogen compounds residing in the processing vessel out of the processing vessel; and
   the third step of introducing a second etching gas containing carbon and fluorine but containing no hydrogen to uninterruptedly continue etching the insulation film.

2. The insulation film etching method according to claim 1, wherein the second step is for purging the interior of the processing vessel with an inert gas.

3. The insulation film etching method according to claim 1, wherein the second step is for introducing $O_2$ gas into the processing vessel to form an atmosphere of $O_2$ plasmas.

4. The insulation film etching method according to claim 1, wherein the second step is for exhausting the interior of the processing vessel for above a prescribed period of time without introducing the fresh gas and with the plasmas turned off.

5. The insulation film etching method for generating plasmas of etching gases in processing vessels to etch an insulation film on a substrate-to-be-processed through a mask pattern in an atmosphere of the plasmas, comprising:
   the first step of introducing a first etching gas containing carbon, fluorine and hydrogen into a first processing vessel to etch the insulation film down to a certain depth;
   the second step of transferring the substrate-to-be-processed from the first processing vessel to a second processing vessel; and
   the third step of introducing a second etching gas containing carbon and fluorine but containing no hydrogen into the second processing vessel to continue etching the insulation film.

6. The insulation film etching method according to claim 1, wherein the insulation film is an organic insulation film.

7. The insulation film etching method according to claim 6, wherein the organic insulation film is an SiOC-based low dielectric constant film.

8. The insulation film etching method according to claim 1, wherein the mask pattern is a resist film.

9. The insulation film etching method according to claim 1, wherein the first etching gas is a mixed gas containing hydrophloro carbon gas, $N_2$ gas and an inert gas.

10. The insulation film etching method according to claim 1, wherein the third step is for etching the insulation film down to the base film.

11. The insulation film etching method according to claim 10, wherein the base film is a nitride film.

12. The insulation film etching method according to claim 11, wherein the nitride film is a silicon nitride film.

13. The insulation film etching method according to claim 10, wherein the base film is a silicon carbide film.

14. The insulation film etching method according to claim 1, wherein the second etching gas is a mixed gas containing phlorocarbon gas, $N_2$ gas and an inert gas.

15. The insulation film etching method according to claim 5, wherein the insulation film is an organic insulation film.

16. The insulation film etching method according to claim 5, wherein the mask pattern is a resist film.

17. The insulation film etching method according to claim 5, wherein the first etching gas is a mixed gas containing hydrophloro carbon gas, $N_2$ gas and an inert gas.

18. The insulation film etching method according to claim 5, wherein the third step is for etching the insulation film down to the base film.

19. The insulation film etching method according to claim 5, wherein the second etching gas is a mixed gas containing phlorocarbon gas, $N_2$ gas and an inert gas.

* * * * *